US 9,660,631 B2

(12) United States Patent
Seo et al.

(10) Patent No.: US 9,660,631 B2
(45) Date of Patent: May 23, 2017

(54) DUTY CYCLE DETECTION CIRCUIT AND METHOD

(71) Applicant: SK hynix Inc., Icheon-si, Gyeonggi-do (KR)

(72) Inventors: Young Suk Seo, Icheon-si (KR); Da In Im, Icheon-si (KR)

(73) Assignee: SK hynix Inc., Icheon-Si (KR)

( * ) Notice: Subject to any disclaimer, the term of this patent is extended or adjusted under 35 U.S.C. 154(b) by 45 days.

(21) Appl. No.: 14/625,868

(22) Filed: Feb. 19, 2015

(65) Prior Publication Data

US 2016/0182019 A1 Jun. 23, 2016

(30) Foreign Application Priority Data

Dec. 22, 2014 (KR) .................. 10-2014-0186093

(51) Int. Cl.
| | | |
|---|---|---|
| *H03K 5/26* | (2006.01) | |
| *G01R 29/02* | (2006.01) | |
| *H03K 3/356* | (2006.01) | |
| *H03K 5/156* | (2006.01) | |

(52) U.S. Cl.
CPC ............ *H03K 5/26* (2013.01); *G01R 29/023* (2013.01); *H03K 3/35613* (2013.01); *H03K 3/356182* (2013.01); *H03K 5/1565* (2013.01)

(58) Field of Classification Search
CPC ........ H03K 5/017; H03K 5/08; H03K 5/1565; H03K 5/26; G01R 29/023
USPC ................................ 327/26, 31, 36, 175, 38
See application file for complete search history.

(56) References Cited

U.S. PATENT DOCUMENTS

| | | | | |
|---|---|---|---|---|
| 5,841,305 A | * | 11/1998 | Wilson ................. | H03K 5/1565 326/87 |
| 7,339,403 B2 | * | 3/2008 | Chen .................... | G01R 29/027 326/95 |
| 7,411,435 B2 | * | 8/2008 | Monma ................ | H03K 5/1565 327/172 |
| 7,612,593 B2 | * | 11/2009 | Kim ........................ | G11C 7/22 327/175 |
| 7,719,921 B2 | * | 5/2010 | Kuroki .................... | G11C 7/22 365/194 |
| 7,791,391 B2 | * | 9/2010 | Yoon ..................... | H03L 7/0814 327/238 |
| 7,795,925 B2 | * | 9/2010 | Marutani ............... | G01R 25/08 324/76.77 |
| 7,800,423 B2 | * | 9/2010 | Kim ..................... | H03K 5/1565 327/172 |
| 7,932,759 B2 | * | 4/2011 | Abe ........................ | H03L 7/087 327/149 |
| 8,004,336 B2 | * | 8/2011 | Yoon .................... | G11C 7/1066 327/233 |

(Continued)

OTHER PUBLICATIONS

Definition of "open circuit" from www.dictionary.com, www.dictionary.com/browse/open-circuit, accessed Nov. 15, 2016.*

*Primary Examiner* — Thomas J Hiltunen
(74) *Attorney, Agent, or Firm* — William Park & Associates Ltd.

(57) ABSTRACT

A duty cycle detection circuit may include: a timing signal generation unit to generate a plurality of timing signal groups by selectively combining multi-phase clock signals according to an enable signal; and a detection unit to generate a duty detection signal by selectively combining signals of the plurality of timing signal groups according to the enable signal.

19 Claims, 5 Drawing Sheets

(56) References Cited

U.S. PATENT DOCUMENTS

| | | | |
|---|---|---|---|
| 8,106,695 B2* | 1/2012 | Miyano | H03L 7/0812 327/172 |
| 8,120,403 B2* | 2/2012 | Miyano | H03K 5/1565 327/158 |
| 8,164,371 B2* | 4/2012 | Monma | H03K 3/017 327/149 |
| 2007/0076832 A1* | 4/2007 | Matsudera | H03L 7/18 375/371 |
| 2009/0128208 A1 | 5/2009 | Song et al. | |

* cited by examiner

DUTY CYCLE DETECTION CIRCUIT AND METHOD

CROSS-REFERENCES TO RELATED APPLICATION

The present application claims priority under 35 U.S.C. §119(a) to Korean application number 10-2014-0186093, filed on Dec. 22, 2014, in the Korean Intellectual Property Office, which is incorporated herein by reference in its entirety.

BACKGROUND

1. Technical Field

Various embodiments relate to a semiconductor circuit, and more particularly, to a duty cycle detection circuit and method.

2. Related Art

With the increase in operating speed of a semiconductor apparatus, that is, the increase in frequency of a clock signal provided from outside the semiconductor apparatus, a timing margin of the semiconductor apparatus has decreased.

Thus, inside the semiconductor apparatus, phase clock signals obtained by dividing the clock signal provided from outside may be used.

The phase relationship of the multi-phase clock signals may determine the duty of the strobe signal, and the phases of the multi-phase clock signals may be adjusted according to information obtained by detecting the duty cycle.

SUMMARY

In an embodiment of the invention, a duty cycle detection circuit may include a timing signal generation unit to generate a plurality of timing signal groups by selectively combining multi-phase clock signals according to an enable signal. The duty cycle detection circuit may also include a detection unit to generate a duty detection signal by selectively combining signals of the plurality of timing signal groups according to the enable signal.

In an embodiment of the invention, there is provided a duty cycle detection method for detecting duty cycles of multi-phase clock signals through a plurality of detection steps. The plurality of detection steps may include a first detection step of detecting a duty cycle difference between some phase clock signals of the multi-phase clock signals. The plurality of detection steps may also include a second detection step of detecting a duty cycle difference between other phase clock signals of the multi-phase clock signals. Further, the plurality of detection steps may include a third detection step of detecting duty cycle differences among the multi-phase clock signals.

In an embodiment, a duty cycle detection circuit includes a timing signal generation unit that generates a plurality of timing signal groups by selectively combining first to fourth phase clock signals according to sequential first to third pulses. The plurality of timing signal groups include a first to a third timing signal group. The duty cycle detection circuit may also include a detection unit that generates a duty detection signal by selectively combining signals of the first timing signal group, the second timing signal group, and the third timing signal group according to the first to third pulses.

DETAILED DESCRIPTION

Hereinafter, a duty cycle detection circuit and method according to the invention will be described below with reference to the accompanying figures through various embodiments. Various embodiments are directed to a duty cycle detection circuit and method capable of accurately detecting a duty cycle.

A semiconductor apparatus to which a duty cycle detection circuit 100 according to an embodiment of the invention can be applied may use divided clocks obtained by dividing an external clock, that is, multi-phase clock signals.

The phase relationship of the multi-phase clock signals may determine the duty of a strobe signal for data output. Further, the phases of the multi-phase clock signals may be adjusted according to information obtained by detecting the duty cycle.

Figure 1:
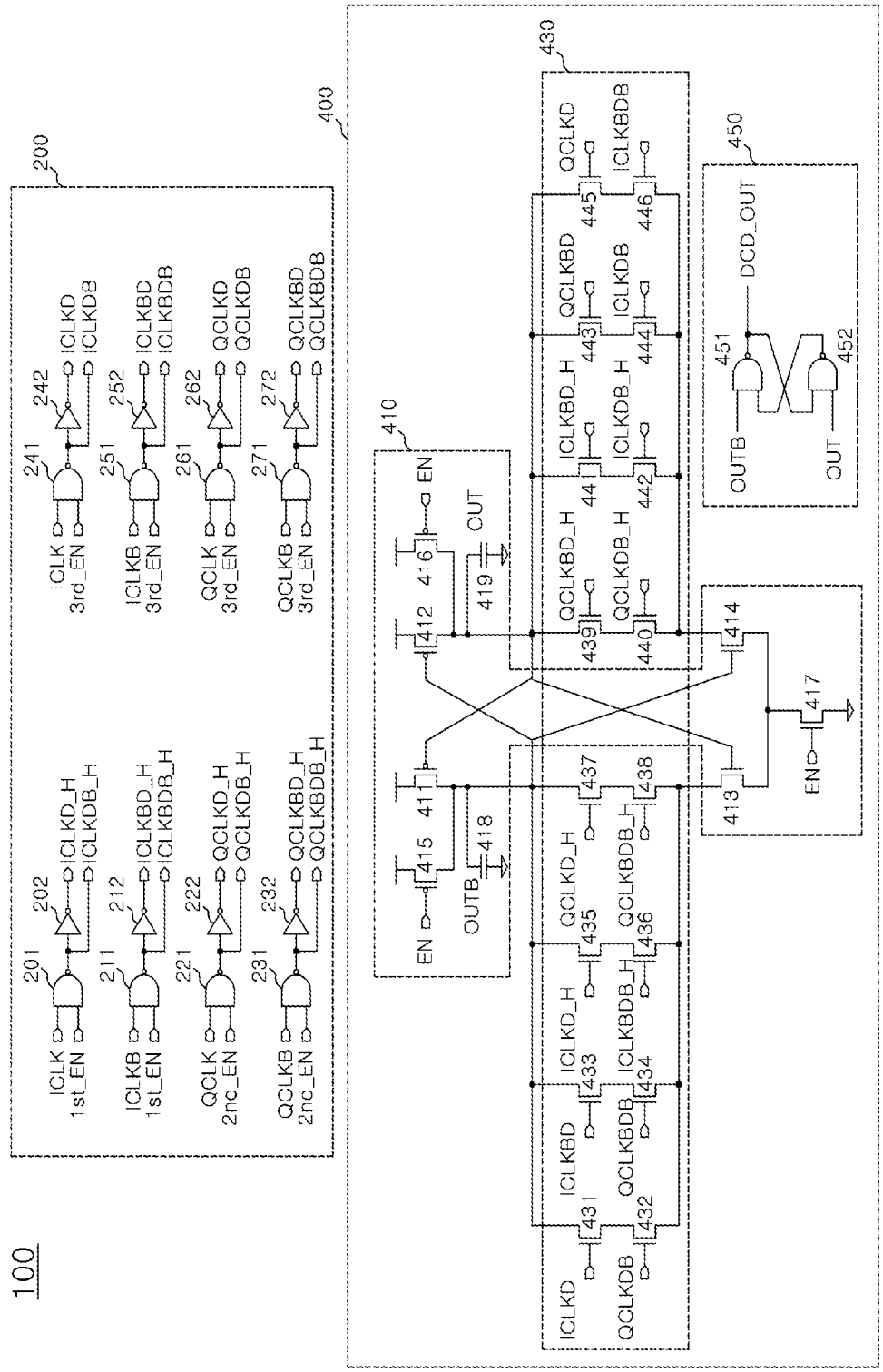
FIG. 1 is a circuit diagram of a duty cycle detection circuit 100 according to an embodiment of the invention.

Referring to FIG. 1, the duty cycle detection circuit 100 according to an embodiment of the invention may include a timing signal generation unit 200 and a detection unit 400.

The timing signal generation unit 200 may generate a plurality of timing signal groups by selectively combining multi-phase clock signals, that is, first to fourth phase clock signals ICLK, ICLKB, QCLK, and QCLKB according to sequential pulses of an enable signal EN, that is, first to third pulses 1st_EN to 3rd_EN.

The plurality of timing signal groups may include a first timing signal group ICLKD_H, ICLKBDB_H, ICLKBD_H, and ICKLDB_H, a second timing signal group QCLKD_H, QCLKBDB_H, QCLKBD_H, and QCKLDB_H, and a third timing signal group ICLKD, QCLKDB, QCLKD, ICLKBDB, ICLKBD, QCKLBDB, QCLKBD, and ICLKDB. The timing signal generation unit 200 generates the first timing signal group ICLKD_H, ICLKBDB_H, ICLKBD_H, and ICKLDB_H by combining first and second phase clock signals according to the enable signal EN, or a first pulse 1st_EN of the sequential pulses of the enable signal EN. The timing signal generation unit 200 also generates the second timing signal group QCLKD_H, QCLKBDB_H, QCLKBD_H, and QCKLDB_H by combining third and fourth phase clock signals according to the enable signal EN, or a second pulse 2nd_EN of the sequential pulses of the enable signal EN. The timing signal generation unit 200 also generates the third timing signal group ICLKD, QCLKDB, QCLKD, ICLKBDB, ICLKBD, QCKLBDB, QCLKBD, and ICLKDB by combining the first to fourth phase clock signals according to the enable signal EN, or the third pulse 3rd_EN of the enable signal EN.

The timing signal generation unit 200 may include first to 16th logic gates 201 to 272.

The first logic gate 201 may generate a timing signal ICLKDB_H by performing a NAND operation on the first pulse 1st_EN of the enable signal EN and the first phase clock signal ICLK.

The second logic gate 202 may generate a timing signal ICLKD_H by inverting the timing signal ICLKDB_H.

The third logic gate 211 may generate a timing signal ICLKBDB_H by performing a NAND operation on the first pulse 1st_EN of the enable signal EN and the second phase clock signal ICLKB.

The fourth logic gate 212 may generate a timing signal ICLKBD_H by inverting the timing signal ICLKBDB_H.

The fifth logic gate 221 may generate a timing signal QCLKDB_H by performing a NAND operation on the second pulse 2nd_EN of the enable signal EN and the third phase clock signal QCLK.

The sixth logic gate 222 may generate a timing signal QCLKD_H by inverting the timing signal QCLKDB_H.

The seventh logic gate 231 may generate a timing signal QCLKBDB_H by performing a NAND operation on the second pulse 2nd_EN of the enable signal EN and the fourth phase clock signal QCLKB.

The eighth logic gate 232 may generate a timing signal QCLKBD_H by inverting the timing signal QCLKBDB_H.

The ninth logic gate 241 may generate a timing signal ICLKDB by performing a NAND operation on the third pulse 3rd_EN of the enable signal EN and the first phase clock signal ICLK.

The tenth logic gate 242 may generate a timing signal ICLKD by inverting the timing signal ICLKDB.

The 11th logic gate 251 may generate a timing signal ICLKBDB by performing a NAND operation on the third pulse 3rd_EN of the enable signal EN and the second phase clock signal ICLKB.

The 12th logic gate 252 may generate a timing signal ICLKBD by inverting the timing signal ICLKBDB.

The 13th logic gate 261 may generate a timing signal QCLKDB by performing a NAND operation on the third pulse 3rd_EN of the enable signal EN and the third phase clock signal QCLK.

The 14th logic gate 262 may generate a timing signal QCLKD by inverting the timing signal QCLKDB.

The 15th logic gate 271 may generate a timing signal QCLKBDB by performing a NAND operation on the third pulse 3rd_EN of the enable signal EN and the fourth phase clock signal QCLKB.

The 16th logic gate 272 may generate a timing signal QCLKBD by inverting the timing signal QCLKBDB.

The detection unit 400 may generate a duty detection signal DCD_OUT by selectively combining the signals of the first timing signal group ICLKD_H, ICLKBDB_H, ICLKBD_H, and ICKLDB_H, the second timing signal group QCLKD_H, QCLKBDB_H, QCLKBD_H, and QCKLDB_H, and the third timing signal group ICLKD, QCLKDB, QCLKD, ICLKBDB, ICLKBD, QCKLBDB, QCLKBD, and ICLKDB according to the first to third pulses 1st_EN to 3rd_EN of the enable signal EN.

The detection unit 400 may generate the duty detection signal DCD_OUT by converting the voltages of activated signals, among the signals of the first timing signal group ICLKD_H, ICLKBDB_H, ICLKBD_H, and ICKLDB_H, the second timing signal group QCLKD_H, QCLKBDB_H, QCLKBD_H, and QCKLDB_H, and the third timing signal group ICLKD, QCLKDB, QCLKD, ICLKBDB, ICLKBD, QCKLBDB, QCLKBD, and ICLKDB, into currents according to the first to third pulses 1st_EN to 3rd_EN of the enable signal EN.

The detection unit 400 may generate the duty detection signal DCD_OUT according to the current of a period in which signal pairs among the signals of the first timing signal group ICLKD_H, ICLKBDB_H, ICLKBD_H, and ICKLDB_H, the second timing signal group QCLKD_H, QCLKBDB_H, QCLKBD_H, and QCKLDB_H, and the third timing signal group ICLKD, QCLKDB, QCLKD, ICLKBDB, ICLKBD, QCKLBDB, QCLKBD, and ICLKDB, are activated at the same time according to the first to third pulses 1st_EN to 3rd_EN of the enable signal EN.

The detection unit 400 may include a current conversion unit 410, an input combination unit 430, and an output unit 450.

The current conversion unit 410 may generate a differential output signal OUT/OUTB by converting an input voltage into a current during an active period of the enable signal EN, or, active periods of the first to third pulses 1st_EN to 3rd_EN. The current conversion unit 410 may also generate differential output signals OUT/OUTB by converting differential input voltages into currents during an active period of the enable signal EN.

The current conversion unit 410 may include first to seventh transistors 411 to 417 and first and second capacitors 418 and 419.

The first to fourth transistors 411 to 414 may form a cross-coupled latch. In addition, the fifth to seventh transistors 415 to 417 may form a current path from a power supply terminal to a ground terminal according to the enable signal EN.

The first and second capacitors 418 and 419 may be discharged according to the operations of the first to seventh transistors 411 to 417 before the enable signal EN is activated. The first and second capacitors 418 and 419 may also output a voltage level difference caused by the discharge as the differential output signal OUT/OUTB.

A differential input voltage may be used as an input voltage of the current conversion unit 410. The differential input voltage may be divided into first and second input voltages.

The input combination unit 430 may select the signals of the first timing signal group ICLKD_H, ICLKBDB_H, ICLKBD_H, and ICKLDB_H, the second timing signal group QCLKD_H, QCLKBDB_H, QCLKBD_H, and QCKLDB_H, and the third timing signal group ICLKD, QCLKDB, QCLKD, ICLKBDB, ICLKBD, QCKLBDB, QCLKBD, and ICLKDB, on a pair basis. Then, the input combination unit 430 may provide the first input voltage based on some signal pairs of a plurality of selected signal pairs and the second input voltage based on the other signal pairs of the plurality of selected signal pairs to the current conversion unit 410.

The input combination unit 430 may generate the first input voltage according to some signal pairs ICLKD/QCLKDB, ICLKBD/QCLKBDB, ICLKD_H/ICLKBDB_H, and QCLKD_H/QCLKBDB_H. In addition, the input combination unit 430 may generate the second input voltage according to the other signals pairs QCLKBD_H/QCLKDB_H, ICLKBD_H/ICLKDB_H, QCLKBD/ICLKDB, and QCLKD/ICLKBDB.

The input combination unit 430 may include a plurality of transistors electrically coupled to the current conversion unit 410 that is, first to 16th transistors 431 to 446.

The drain terminals of the first, third, fifth, and seventh transistors 431, 433, 435, and 437 may be commonly electrically coupled to a differential output signal terminal OUTB of the current conversion unit 410.

The source terminals of the second, fourth, sixth, and eighth transistors 432, 434, 436, and 438 may be commonly electrically coupled to the drain terminal of the third transistor 413 of the current conversion unit 410.

The source terminals of the first, third, fifth, and seventh transistors 431, 433, 435, and 437 may be electrically coupled to the drain terminals of the second, fourth, sixth, and eighth transistors 432, 434, 436, and 438, respectively.

The drain terminals of the ninth, 11th, 13th, and 15th transistors 439, 441, 443, and 445 may be commonly electrically coupled to a differential output signal terminal OUT of the current conversion unit 410.

The source terminals of the tenth, 12th, 14th, and 16th transistors 440, 442, 444, and 446 may be commonly electrically coupled to the drain terminal of the fourth transistor 414 of the current conversion unit 410.

The source terminals of the ninth, 11th, 13th, and 15th transistors 439, 441, 443, and 445 may be electrically coupled to the drain terminals of the tenth, 12th, 14th, and 16th transistors 440, 442, 444, and 446, respectively.

The first to 16th transistors 431 to 446 may receive the timing signals ICLKD, QCLKDB, ICLKBD, QCLKBDB, ICLKD_H, ICLKBDB_H, QCLKD_H, QCLKBDB_H, QCLKD_H, QCLKDB_H, ICLKBD_H, ICLKDB_H, QCLKBD, ICLKDB, QCLKD, and ICLKBDB through the respective gates.

The output unit 450 may generate the duty detection signal DCD_OUT according to the differential output signals OUT/OUTB.

The output unit 450 may be implemented with an SR latch. The output unit 450 may also include first and second logic gates 451 and 452.

The first logic gate 451 may perform a NAND operation on the differential output signal OUTB and an output of the second logic gate 452 and output the operation result as the duty detection signal DCD_OUT.

The second logic gate 452 may perform a NAND operation on the output of the first logic gate 451 and the differential output signal OUT and output the operation result.

Hereafter, referring to FIGS. 2A to 2C, a duty cycle detection method according to an embodiment of the invention will be described as follows.

The duty cycle detection method according to an embodiment of the invention may be performed through a plurality of detection steps. The plurality of detection steps may include a first detection step of detecting a duty cycle difference between some phase clock signals of a plurality of phase clock signals. A second detection step may include detecting a duty cycle difference between the other phase clock signals of the plurality of phase clock signals. Further, a third detection step may include detecting duty cycle differences among the plurality of phase clock signals.

According to the sequential pulses of the enable signal for controlling the duty cycle detection circuit, sections of the respective detection steps may be determined.

The first detection step may include detecting a duty cycle difference between signals corresponding to first and second phase clock signals included in multi-phase clock signals among the signals of the plurality of timing signal groups.

The second detection step may include detecting a duty cycle difference between signals corresponding to third and fourth phase clock signals included in the multi-phase clock signals among the signals of the plurality of timing signal groups.

The third detection step may include detecting duty cycle differences among the signals corresponding to the first to fourth phase clock signals included in the multi-phase clock signals among the signals of the plurality of timing signal groups.

In an embodiment of the invention, the duty cycle detection operation for the multi-phase clock signals, that is, the first to fourth phase clock signals ICLK, ICLKB, QCLK, and QCLKB may be performed through the three-step detection sections.

The first detection step may be performed on the basis of some signals of the multi-phase clock signals, for example, the first and second phase clock signals ICLK and ICLKB. The first detection step may detect a duty cycle difference between some phase clock signals shown above of the multi-phase clock signals.

The second detection step may be performed on the basis of the other signals of the multi-phase clock signals, for example, the third and fourth phase clock signals QCLK and QCLKB. The second detection step may detect a duty cycle difference between the other phase clock signals of the multi-phase clock signals.

The third detection step may be performed by reflecting the results of the first and second detection steps, based on the full-rate clock reference signals, that is, all of the first to fourth phase clock signals ICLK, ICLKB, QCLK, and QCLKB. The third detection step may detect duty cycle differences among the multi-phase clock signals.

The sequential pulses of the enable signal EN, that is, the first to third pulses 1st_EN to 3rd_EN may be used as signals for defining the sections of the first to third detection steps.

First, referring to FIG. 2A, the first detection step will be described as follows.

The first detection step may include detecting a duty difference by detecting a difference between a current amount in a section from a rising edge of the first phase clock signal ICLK to a rising edge of the second phase clock signal ICLKB and a current amount in a section from a rising edge of the second phase clock signal ICLKB and a rising edge of the first phase clock signal ICLK.

At this time, the section from the rising edge of the first phase clock signal ICLK to the rising edge of the second phase clock signal ICLKB may correspond to a section wherein both of the signals ICLKD_H and ICLKBDB_H are at a high level.

The section from the rising edge of the second phase clock signal ICLKB to the rising edge of the first phase clock signal ICLK may correspond to a section wherein both of the signals ICLKBD_H and ICLKDB_H are at a high level.

Figure 2A:
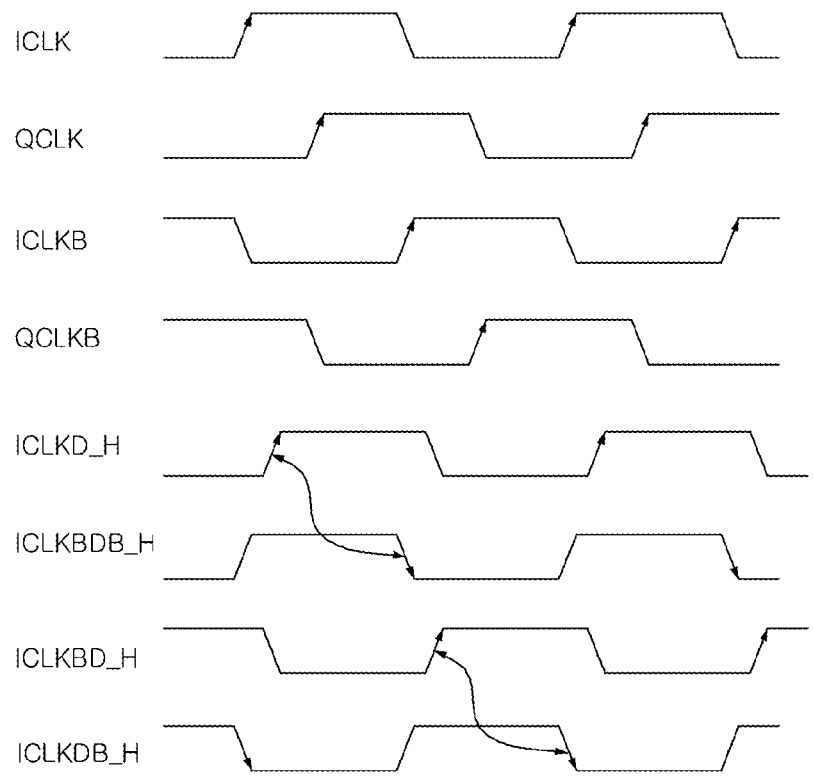
FIGS. 2A to 2C are timing diagrams for describing a duty cycle detection method according to an embodiment of the invention.

As illustrated in FIG. 2A, when the first pulse 1st_EN of the enable signal EN is activated, the fifth and sixth transistors 435 and 436 of the input combination unit 430 may be turned on during the section wherein the timing signals ICLKBD_H and ICLKDB_H are at a high level. Accordingly, the first capacitor 418 of the current conversion unit 410 may be discharged.

Then, the 11th and 12th transistors 441 and 442 of the input combination unit 430 may be turned on during the section in which both of the signals ICLKBD_H and ICLKDB_H are at a high level. As a result, the second capacitor 419 of the current conversion unit 410 may be discharged.

Figure 2B:
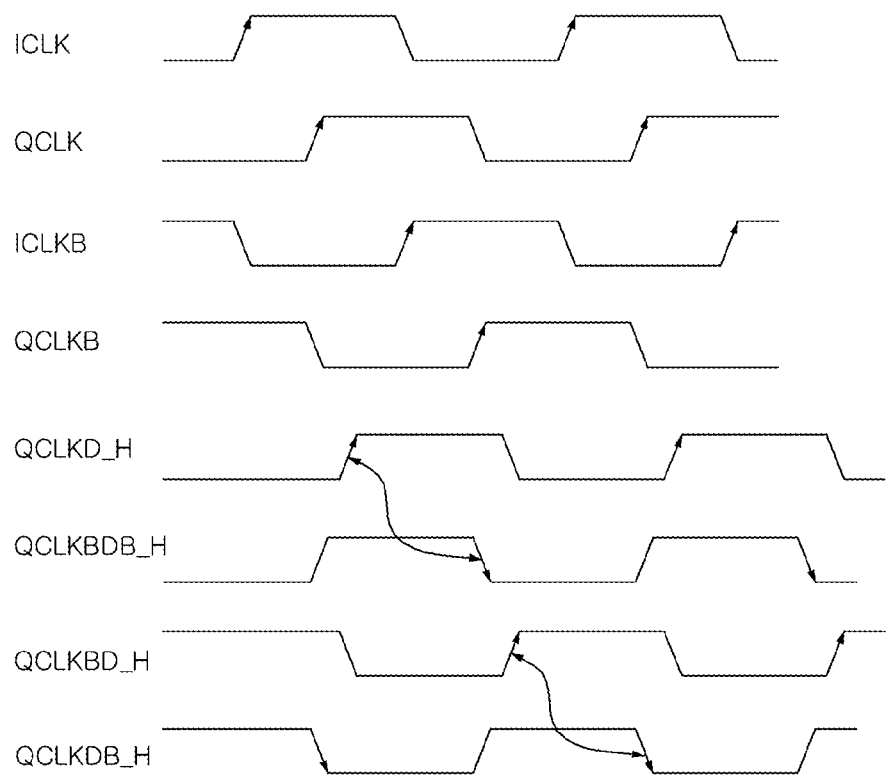

Referring to FIG. 2B, the second detection step will be described as follows.

The second detection step may include detecting a duty difference by detecting a difference between a current amount in a section from a rising edge of the third phase clock signal QCLK to a rising edge of the fourth phase clock signal QCLKB and a current amount in a section from a rising edge of the fourth phase clock signal QCLKB and a rising edge of the third phase clock signal QCLK.

At this time, the section from the rising edge of the third phase clock signal QCLK to the rising edge of the fourth phase clock signal QCLKB may correspond to a section wherein both of the signals QCLKD_H and QCLKBDB_H are at a high level.

The section from the rising edge of the fourth phase clock signal QCLKB to the rising edge of the third phase clock signal QCLK may correspond to a section wherein both of the signals QCLKBD_H and QCLKDB_H are at a high level.

In FIG. 2B, when the second pulse 2nd_EN of the enable signal EN is activated, the seventh and eighth transistors 437 and 438 of the input combination unit 430 may be turned on during the section in which the timing signals QCLKD_H and QCLKBDB_H are at a high level. Accordingly, the first capacitor 418 of the current conversion unit 410 may be discharged.

Then, the ninth and tenth transistors 439 and 440 of the input combination unit 430 may be turned on during the section in which both of the signals ICLKBD_H and ICLKDB_H are at a high level. As a result, the second capacitor 419 of the current conversion unit 410 may be discharged.

Figure 2C:
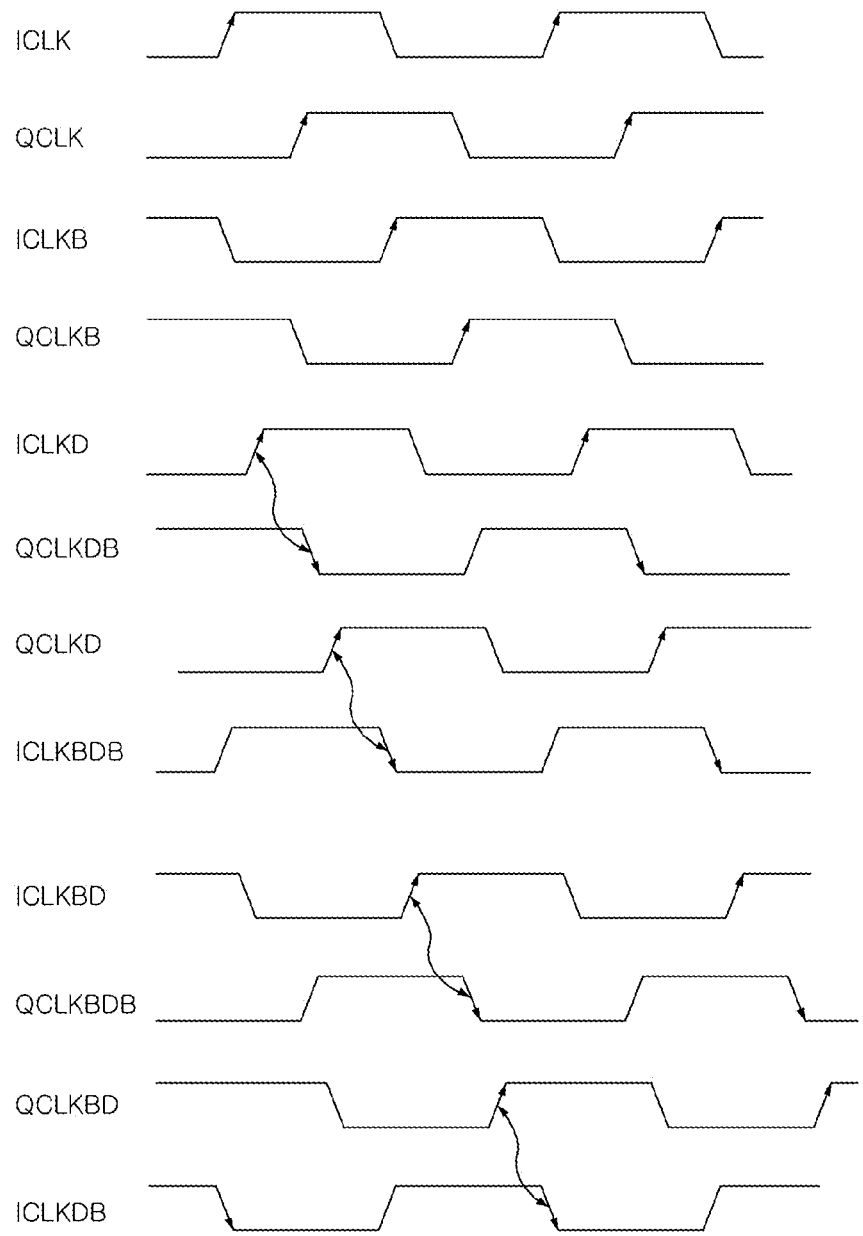

Referring to FIG. 2C, the third detection step will be described as follows.

The third detection step may include detecting duty cycle differences for the full-rate clock reference signals, or, all of the first to fourth phase clock signals ICLK, ICLKB, QCLK, and QCLKB.

The third detection step may include detecting a final duty cycle difference by detecting differences among a current amount in a section from a rising edge of the first phase clock signal ICLK to a rising edge of the fourth phase clock signal QLCKB; a current amount in a section from a rising edge of the third phase clock signal QCLKB to a rising edge of the second phase clock signal ICLKB; a current amount in a section from a rising edge of the second phase clock signal ICLKB and a rising edge of the fourth phase clock signal QCLKB; and a current amount in a section from a rising edge of the fourth phase clock signal QCLKB to a rising edge of the second phase clock signal ICLKB.

At this time, the section from the rising edge of the first phase clock signal ICLK to the rising edge of the fourth phase clock signal QCLKB may correspond to a section wherein both of the signals ICLKD and QCLKDB are at a high level.

The section from the rising edge of the third phase clock signal QCLKB to the rising edge of the second phase clock signal ICLKB may correspond to a section wherein both of the signals QCLKD and ICLKBDB are at a high level.

The section from the rising edge of the second phase clock signal ICLKB to the rising edge of the fourth phase clock signal QCLKB may correspond to a section wherein both of the signals ICLKBD and QCLKBDB are at a high level.

The section from the rising edge of the fourth phase clock signal QCLKB to the rising edge of the second phase clock signal ICLKB may correspond to a section wherein both of the signals QCLKBD and ICLKDB are at a high level.

In FIG. 2C, when the third pulse 3rd_EN of the enable signal EN is activated, the first and second transistors 431 and 432 of the input combination unit 430 may be turned on during the section wherein both of the signals ICLKD and QCLKDB are at a high level. Accordingly, the first capacitor 418 of the current conversion unit 410 may be discharged.

Then, the 15th and 16th transistors 445 and 446 of the input combination unit 430 may be turned on during the section wherein both of the signals QCLKD and ICLKBDB are at a high level. As a result, the second capacitor 419 of the current conversion unit 410 may be discharged.

Then, the third and fourth transistors 433 and 434 of the input combination unit 430 may be turned on during the section wherein both of the signals ICLKBD and QCLKBDB are at a high level. Thus, the first capacitor 418 of the current conversion unit 410 may then be discharged.

The 13th and 14th transistors 443 and 444 of the input combination unit 430 may then be turned on during the section in which both of the signals QCLKBD and ICLKDB are at a high level. Accordingly, the second capacitor 419 of the current conversion unit 410 may be discharged.

According to the first to third detection operations, the current amounts of the first and second capacitors 418 and 419 of the current conversion unit 410 may be varied. In addition, a difference between the current amounts of the first and second capacitors 418 and 419 may be outputted as the differential output signal OUT/OUTB.

The output unit 450 may generate the duty detection signal DCD_OUT according to the level difference between the differential output signals OUT/OUTB.

The semiconductor apparatus may adjust the duty cycles of the multi-phase clock signals, or, the first to fourth phase clock signals ICLK, ICLKB, QCLK, and QCLKB according to the duty detection signal DCD_OUT.

Figure 3:
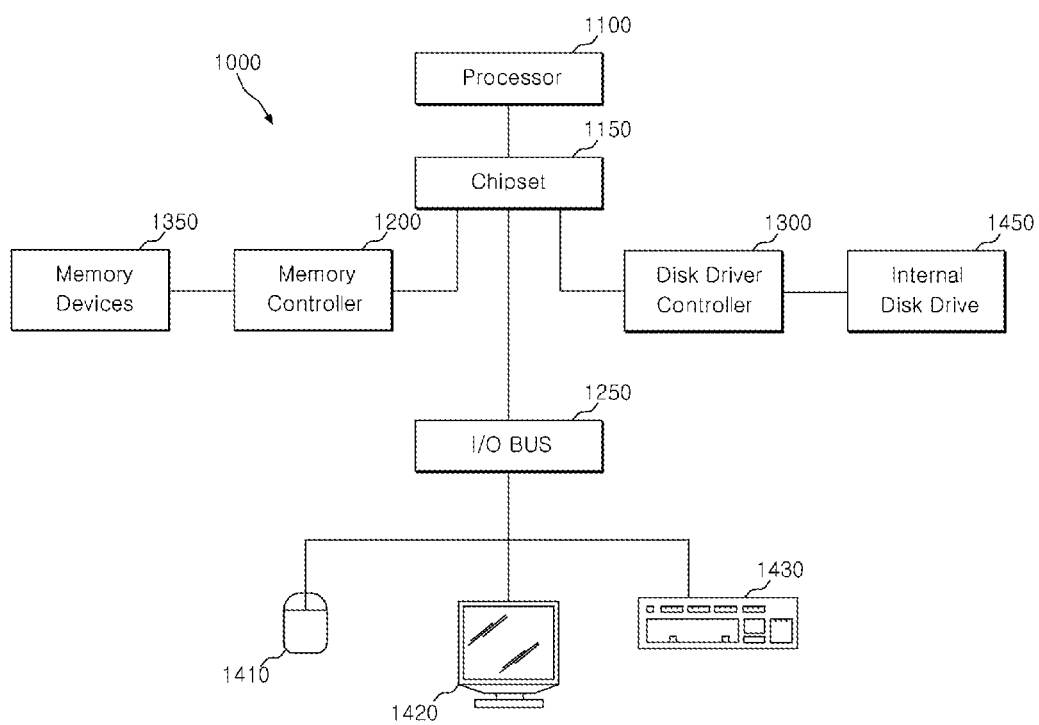
FIG. 3 illustrates a block diagram of a system employing a memory controller circuit in accordance with an embodiment of the invention.

Referring to FIG. 3, a system 1000 may include one or more processors 1100. The processor 1100 may be used individually or in combination with other processors. A chipset 1150 may be electrically coupled to the processor 1100. The chipset 1150 is a communication pathway for signals between the processor 1100 and other components of the system 1000. Other components may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be electrically coupled to the chipset 1150. The memory controller 1200 can receive a request provided from the processor 1100 through the chipset 1150. The memory controller 1200 may be electrically coupled to one or more memory devices 1350. The memory devices 1350 may include the duty cycle detection circuit described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420 and 1430.

The disk drive controller 1300 may also be electrically coupled to the chipset 1150. The disk drive controller 1300 may serve as the communication pathway between the chipset 1150 and one or more internal disk drives 1450. The disk drive controller 1300 and the internal disk drives 1450 may communicate with each other or with the chipset 1150 using virtually any type of communication protocol.

While certain embodiments have been described above, it will be understood to those skilled in the art that the embodiments described are by way of examples only. Accordingly, the apparatus and method described should not be limited based on the described embodiments above. Rather, the apparatus and method described should only be limited in light of the claims that follow when taken in conjunction with the above description and accompanying figures.

What is claimed is:

1. A duty cycle detection circuit comprising:
 a timing signal generation unit to generate a plurality of timing signal groups by selectively combining multi-phase clock signals according to an enable signal; and a detection unit to generate a duty detection signal by selectively combining signals of the plurality of timing signal groups when the detection unit is activated, wherein the detection unit is activated according to the enable signal.

2. The duty cycle detection circuit according to claim 1, wherein a current path from a power supply terminal of the detection unit to a ground terminal of the detection unit is turned-on when the enable signal is activated.

3. The duty cycle detection circuit according to claim 1, wherein the detection unit selectively combines the signals of the plurality of timing signal groups according to sequential pulses of the enable signal.

4. The duty cycle detection circuit according to claim 1, wherein the timing signal generation unit generates a first timing signal group among the plurality of timing signal groups by combining first and second phase clock signals of the multi-phase clock signals according to the enable signal, generates a second timing signal group among the plurality of timing signal groups by combining third and fourth phase clock signals of the multi-phase clock signals according to the enable signal, and generates a third timing signal group among the plurality of timing signal groups by combining the first to fourth phase clock signals according to the enable signal.

5. The duty cycle detection circuit according to claim 1, wherein the timing signal generation unit generates a first timing signal group among the plurality of timing signal groups by combining first and second phase clock signals of the multi-phase clock signals according to a first pulse of sequential pulses of the enable signal, generates a second timing signal group among the plurality of timing signal groups by combining third and fourth phase clock signals of the multi-phase clock signals according to a second pulse of the sequential pulses of the enable signal, and generates a third timing signal group among the plurality of timing signal groups by combining the first to fourth phase clock signals according to a third pulse of the sequential pulses of the enable signal.

6. The duty cycle detection circuit according to claim 1, wherein the detection unit generates the duty detection signal by converting voltages of activated signals among the signals of the plurality of timing signal groups into currents.

7. The duty cycle detection circuit according to claim 1, wherein the detection unit generates the duty detection signal according to a current of a section in which signal pairs among the signals of the plurality of timing signal groups are activated at a same time.

8. The duty cycle detection circuit according to claim 1, wherein the detection unit comprises:
a current conversion unit to generate differential output signals by converting input voltages into currents during an active period of the enable signal;
an input combination unit to select the signals of the plurality of timing signal groups on a pair basis, and provide voltages based on the selected one or more signal pairs as the input voltages to the current conversion unit; and
an output unit to generate the duty detection signal in response to the differential output signals.

9. The duty cycle detection circuit according to claim 8, wherein the output unit comprises a latch.

10. The duty cycle detection circuit according to claim 1, wherein the detection unit comprises:
a current conversion unit to generate differential output signals by converting differential input voltages into currents during an active period of the enable signal;
an input combination unit to select the signals of the plurality of timing signal groups on a pair basis, and provide a first input voltage based on some signal pairs of the selected signal pairs and a second input voltage based on the other signal pairs of the selected signal pairs as the differential input voltages to the current conversion unit; and
an output unit to generate the duty detection signal in response to the differential output signals.

11. A duty cycle detection method for detecting duty cycles of multi-phase clock signals through a plurality of detection steps,
wherein the plurality of detection steps comprise:
a first detection step of detecting a duty cycle difference between some phase clock signals of the multi-phase clock signals;
a second detection step of detecting a duty cycle difference between other phase clock signals of the multi-phase clock signals; and
a third detection step of detecting duty cycle differences among the multi-phase clock signals,
wherein sections of the respective detection steps are determined according to sequential pulses of an enable signal for controlling a duty cycle detection circuit.

12. The duty cycle detection method according to claim 11, further comprising:
generating a plurality of timing signal groups by selectively combining the multi-phase clock signals according to sequential pulses of the enable signal for controlling a duty cycle detection circuit.

13. The duty cycle detection method according to claim 12, wherein the first detection step comprises detecting a duty cycle difference between signals corresponding to first and second phase clock signals included in the multi-phase clock signals, among signals of the plurality of timing signal groups.

14. The duty cycle detection method according to claim 12, wherein the second detection step comprises detecting a duty cycle difference between signals corresponding to third and fourth phase clock signals included in the multi-phase clock signals, among signals of the plurality of timing signal groups.

15. The duty cycle detection method according to claim 12, wherein the third detection step comprises detecting duty cycle differences among signals corresponding to first to fourth phase clock signals included in the multi-phase clock signals, among signals of the plurality of timing signal groups.

16. A duty cycle detection circuit comprising:
a timing signal generation unit that generates a plurality of timing signal groups by selectively combining first to fourth phase clock signals according to sequential first to third pulses,
wherein the plurality of timing signal groups include a first to a third timing signal group; and
a detection unit that generates a duty detection signal by selectively combining signals of the first timing signal group, the second timing signal group, and the third timing signal group according to the first to third pulses.

17. The duty cycle detection circuit according to claim 16, wherein the detection unit generates the duty detection signal according to a current of a period where signal pairs among the signals of the first timing signal group, the second timing signal group, and the third timing signal group are activated at a same time according to the first to third pulses.

18. The duty cycle detection circuit according to claim 16, further comprising:
 a current conversion unit to generate a differential output signal by converting an input voltage into a current during active periods of the first to third pulses.

19. The duty cycle detection circuit according to claim 16, wherein the detection unit generates the duty detection signal by converted voltages of activated signals among the signals of the first timing signal group, the second timing signal group, and the third timing signal group into currents according to the first to third pulses.

\* \* \* \* \*